US012771349B2

(12) United States Patent
Venugopal et al.

(10) Patent No.: US 12,771,349 B2
(45) Date of Patent: Oct. 20, 2026

(54) GLITCH SUPPRESSION IN A LEVEL SHIFTING CIRCUIT DURING POWER UP

(71) Applicant: APPLE INC., Cupertino, CA (US)

(72) Inventors: Vivekanandan Venugopal, Saratoga, CA (US); Ajay Bhatia, Saratoga, CA (US); Animesh Datta, San Diego, CA (US)

(73) Assignee: Apple Inc., Cupertino, CA (US)

(*) Notice: Subject to any disclaimer, the term of this patent is extended or adjusted under 35 U.S.C. 154(b) by 48 days.

(21) Appl. No.: 18/988,862

(22) Filed: Dec. 19, 2024

(65) Prior Publication Data

US 2026/0095184 A1 Apr. 2, 2026

Related U.S. Application Data

(60) Provisional application No. 63/700,183, filed on Sep. 27, 2024.

(51) Int. Cl.
*H03K 19/0185* (2006.01)
*H03L 5/00* (2006.01)

(52) U.S. Cl.
CPC ............................ *H03K 19/018521* (2013.01)

(58) Field of Classification Search
CPC ....... H03K 19/0185; H03K 19/018521; H03K 19/018528; H03L 5/00
USPC .......................................................... 327/333
See application file for complete search history.

(56) References Cited

U.S. PATENT DOCUMENTS 10,838,483 B2 * 11/2020 Venugopal ............ G06F 1/3296
11,923,845 B1 * 3/2024 Kronmüller ..... H03K 3/356182
12,549,183 B2 * 2/2026 Kang ............. H03K 19/017509

* cited by examiner

*Primary Examiner* — Hai L Nguyen
(74) *Attorney, Agent, or Firm* — DICKINSON WRIGHT RLLP

(57) ABSTRACT

Glitch suppression in a level shifting circuit during power up is disclosed. A level shifting circuit is configured to receive an input signal based on a first voltage domain and generate an output signal based on a second voltage domain. The level shifting circuit is also configured to receive a control signal that is operable to suppress the output signal. A control circuit is configured to provide the control signal to the level shifting circuit such that the output signal fluctuations of the level shifting circuit is suppressed during a power up to a power supply voltage.

19 Claims, 11 Drawing Sheets

GLITCH SUPPRESSION IN A LEVEL SHIFTING CIRCUIT DURING POWER UP

CROSS REFERENCE TO RELATED APPLICATION

This application is a non-provisional utility application for patent entitled to a filing date and claiming the benefit of earlier-filed U.S. Provisional Ser. No. 63/700,183, filed Sep. 27, 2024, which is hereby incorporated herein by reference in its entirety.

BACKGROUND

Technical Field

Embodiments described herein are related to the field of integrated circuit implementation, and more particularly to level shifting circuits.

Description of the Related Art

Integrated circuits (ICs), such as, for example, systems-on-chip (SoCs), may include more than one power supply for supplying power to various circuits in a given SoC. Some power supplies may output a power signal at a different voltage level from other power supplies. In some SoCs, one or more voltage regulators may be used to generate power signals of varying voltage levels from a given power supply. These various power signals may be used by different circuits in an SoC, each power signal supplying power in what may be referred to as a respective "power domain" or "voltage domain." Circuits being powered by a common power signal may be considered to be in the same power domain. In an example SoC, a processing core may be in a first power domain and a memory may be in a second power domain. Data and control signals used between the core and the memory may need to be shifted from the first power domain to the second power domain, and vice versa, through the use of level shifting circuits.

SUMMARY

Various embodiments of glitch suppression in a level shifting circuit during power up are disclosed. Various embodiments of a level shifting circuit are also disclosed. A level shifting circuit is configured to receive an input signal based on a first voltage domain and generate an output signal based on a second voltage domain. The level shifting circuit is also configured to receive a control signal in the first voltage domain that is operable to suppress the output signal. A control circuit is configured to provide the control signal to the level shifting circuit such that the output signal fluctuations of the level shifting circuit are suppressed during a power up to a power supply voltage.

BRIEF DESCRIPTION OF THE DRAWINGS

The following detailed description makes reference to the accompanying drawings, which are now briefly described.

Figure 1:
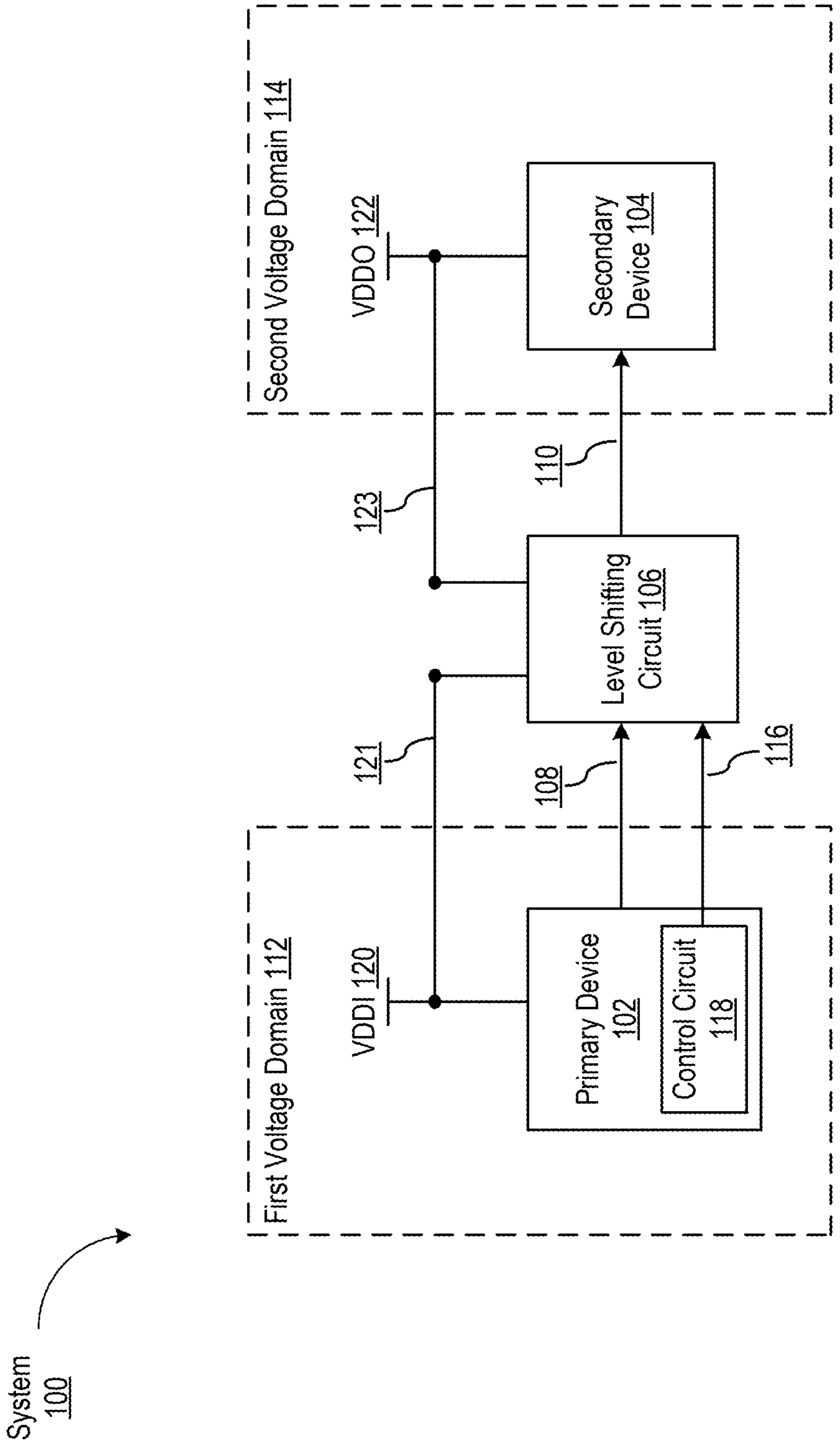
FIG. 1 illustrates a block diagram of an example system including a level shifting circuit configured in accordance with one or more embodiments of the present disclosure.

While the disclosure is susceptible to various modifications and alternative forms, specific embodiments thereof are shown by way of example in the drawings and will herein be described in detail. It should be understood, however, that the drawings and detailed description are not intended to limit the disclosure to the particular form illustrated, but are intended to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

The present disclosure relates to the operation of electric circuits in digital devices, which rely on transistors. To aid the reader, certain terminology used in conjunction with digital devices is first explained.

One type of transistor commonly used in digital devices is a Metal-Oxide Semiconductor Field-Effect Transistor (MOSFET). MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples, it is noted that any suitable digital logic process may be used for the circuits described in this disclosure.

It is noted that 'high', 'enabled', and 'logic high' refer to a signal having a voltage that is above a preset threshold for identifying a binary logic value of '1'. These terms also refer to a voltage sufficiently large to turn on a n-channel MOSFET and turn off a p-channel MOSFET. Whereas, 'low', 'disabled', and 'logic low' refer to a signal having a voltage that is below a preset threshold for identifying a binary logic value of '0'. These terms also refer to a voltage that is sufficiently small enough to turn off a n-channel MOSFET and turn on a p-channel MOSFET. In various other embodiments, different technology may result in different voltage levels for "low" and "high."

Digital devices may include multiple circuits operating at different power supply levels. A voltage level of a power signal from one power supply may be different than a voltage level of other power supplies. As referred to herein, a 'power domain' or a 'voltage domain' refers to a group of circuits coupled to a common power signal. When a logic signal is transmitted from a first voltage domain into a second voltage domain, the signal may need to be level shifted to a voltage level that is compatible with the second voltage domain, and vice versa when transmitting a signal from the second voltage domain to the first. Different voltage domains will typically use different thresholds for determining whether a signal is a logic low, a logic high, or is undefined. For example, a first circuit may be a 1.2V voltage domain, meaning logic signals transition between approximately 1.2V and 0V to indicate logic high and logic low levels, respectively. A second circuit may be in a 0.8V voltage domain, meaning logic signals transition between approximately 0.8V and 0V to indicate logic high and logic low levels, respectively. A logic level from the 1.2V domain may be too high of a voltage level for the 0.8V domain, and could possibly damage circuits. Conversely, a logic high level from the 0.8V domain may be too low to be detected as a logic high in the 1.2V domain. In addition, voltage level mismatches between voltage domains may cause leakage or other performance issues due to transistors not being turned on completely by the mismatched voltage level. Level shifting circuits may be used to transmit logic signals between voltage domains and mitigate these types of issues.

Level shifting circuits enable communication between devices in different voltage domains by receiving an input signal that is based on one supply voltage (referred to herein as 'VDDI') and generating an output signal that is based on a different supply voltage (referred to herein as 'VDDO'). Thus, a level shifting circuit is configured to shift the voltage level of signals transmitted by a first device in a first voltage domain to signals that are compatible with a second device in a second voltage domain. In this way, the second device receives a signal that is compatible with its voltage domain. In order to convert a signal from one voltage domain to another, a level shifting circuit receives the supply voltages of both voltage domains. That is, the level shifting circuit receives both VDDI from a VDDI power rail and VDDO from a VDDO power rail.

Typically, power is supplied in one voltage domain before power is supplied in another voltage domain. For example, a primary device (e.g., a processor core) may be powered up before a secondary device in a different power domain. A problem can arise due to the voltage ramp up of the VDDO rail. For example, if the VDDO voltage domain is a 0.8V domain, all components connected to the VDDO rail will experience the increase from 0.0V to 0.8V. Even though this may occur rapidly, digital devices are susceptible to even minor fluctuations in supply voltage. Because level shifting circuit relies on VDDO, the transiency of the voltage during power up of the VDDO rail can cause a glitch in the output of level shifting circuit. This glitch can occur during a cold boot where VDDI is powered up before VDDO is powered up, or during a reset where VDDO is turned off and back on.

A 'glitch' can be generally defined as an error in the output of a level shifting circuit, and can include an error due to the transiency of the VDDO during rail power up that can cause the output voltage of the level shifting circuit to rise above a threshold voltage used to indicate logic high. For example, as the VDDO rail is ramping up, there may be insufficient voltage during the ramp up phase to turn off a particular p-channel transistor, which could cause a node in a level shifting circuit to be pulled high when, at full VDDO voltage, the node would actually be pulled low. This node error could be propagated through the level shifting circuit, causing the output signal of the level shifting circuit to be logic high instead of an intended logic low. The glitch may be brief and will be resolved as VDDO reaches its operating voltage. However, even a very brief output error by from the level shifting circuit could have negative impacts in the operation of a receiving device, such as the receiving of incorrect data or an incorrect control signal.

Consider an example where the VDDI rail is powered up and power to the VDDO rail is initiated. While VDDO is ramping up, the input to the level shifting circuit from a primary device is held at logic low. However, during VDDO ramp up, a glitch occurs in the output signal of the level shifting circuit while VDDO is in transition, causing the output signal to spike to logic high despite that input signal being logic low. The receiving device could read this erroneous output before the output signal is eventually corrected as VDDO reaches the full supply voltage level. Notably, glitch suppression of the output of the level shifting circuit cannot be carried out by control logic in the VDDO domain during ramp up of VDDO, as there is no signal in the VDDO domain that is isolated from the ramp up. Previous techniques to obtain an isolated signal utilize off-chip control logic and a control signal through a general purpose I/O. This control signal is used in the VDDO domain to prevent the receiving device from detecting the glitch. However, it is preferable to provide a control signal generated on-chip, thus avoiding the use of a general purpose I/O for the control signal.

In accordance with embodiments of the present disclosure, the output of the level shifting circuit to a receiving device is controlled to match the input of the level shifting circuit. This advantage is realized, at least in part, by a control signal that has the effect of suppressing the voltage level of the output of the level shifting circuit, thus restraining the output to a voltage level that is below the voltage threshold for a logic high. Based on the control signal, this output suppressing effect is enabled to effectively disable the output of the level shifting circuit.

For further explanation, FIG. 1 sets forth an example system 100 for glitch suppression in a level shifting circuit during power up in accordance with at least one embodiment of the present disclosure. The example system 100 of FIG. 1 includes primary device 102 that is interfaced with secondary device 104 through level shifting circuit 106. Various implementations of system 100 are contemplated. For example, system 100 can be an SoC or system-in-package (SiP) such that primary device 102 and secondary device 104 are coupled by a common substrate or interposer. In another example, primary device 102 and secondary device 104 can be non-integrated, or remote from one another, and coupled though a physical interface (e.g., a bus, an optical interface, etc.). In various implementations, primary device 102 and secondary device 104 may be different circuit modules fabricated on the same die, different dies in the same package, different packages, or various other form factor combinations.

Primary device 102 operates in a first voltage domain 112 that uses a first power supply voltage VDDI 120 and secondary device 104 operates in a second voltage domain 114 that uses a second power supply voltage VDDO 122. ower is supplied in the first voltage domain 112 before power is supplied in the second voltage domain 114. In other words, VDDI 120 corresponds to the supply voltage of voltage domain 112 of the input to level shifting circuit 106 and VDDO 122 corresponds to the supply voltage of voltage domain 114 of the output from level shifting circuit 106. The power sources of VDDI 120 and VDDO 122 can be one or more voltage regulators. VDDI 120 is distributed to devices via a VDDI power rail 121. VDDO 122 is distributed to devices via a VDDO power rail 123. The supply of VDDI 120 is initiated before initiating the supply of VDDO 122.

Primary device 102 can be, for example, a processor that includes logic for computational operations. For example, a processor may be a central processing unit (CPU), graphics processing unit (GPU), microprocessor, microcontroller, application-specific integrated circuit (ASIC), field-programmable gate array (FPGA), or other computational logic integrated circuit device. In some examples, the processor includes multiple processor cores. It will be appreciated, however, that a processor is merely one example of primary device 102 and that primary device 102 is not limited to any particular type of device. Primary device 102 is coupled to a VDDI power rail 121 that distributes VDDI 120 to transistors and other components in primary device 102.

Secondary device 104 can be, for example, a memory device such as a module of one or more DRAM modules. However, in other examples, secondary device 104 can be another processor, an accelerator, a peripheral device, and so on. Thus, it will be appreciated that secondary device 104 is also not limited to any particular type of device. Secondary device 104 is coupled to the VDDO power rail 123 that distributes VDDO 122 to transistors and other components in secondary device 104.

Level shifting circuit 106 is configured to shift the voltage level of signals transmitted from primary device 102 to secondary device 104 from the first voltage domain 112 to the second voltage domain 114. That is, level shifting circuit 106 converts a signal that is based on VDDI 120 to a signal that is based on VDDO 122. In the example of FIG. 1, level shifting circuit 106 receives input signal 108 from primary device 102 and generates output signal 110 that is provided to secondary device 104. In this way, secondary device 104 receives a signal that is compatible with its voltage domain. To convert a signal from one voltage domain to another, level shifting circuit receives the supply voltages of both voltage domains. That is, level shifting circuit receives both VDDI 120 and VDDO 122.

In accordance with embodiments of the present disclosure, level shifting circuit 106 also receives control signal 116 in the VDDI domain from control circuit 118. In some examples, control circuit 118 is implemented by a power management circuit that controls the supply of VDDO 122 to the VDDO power rail 123. In other examples, control circuit 118 is coupled to such a power management circuit. As the power management circuit controls the supply of VDDO 122, control circuit 118 can identify when a ramp up of VDDO 122 is initiated. Control circuit 118 can also identify when a ramp up of VDDO 122 has completed by, for example, counting a number a cycles as ramp up of VDDO 122 is initiated to determine that a predetermined ramp up period has elapsed. The control signal 116 is operable to suppress a voltage level of output signal 110 in a manner that prevents a glitch on output signal 110. During a cold boot of system 100 or a reset of secondary device 104, the control circuit 118 holds the control signal 116 at logic low during VDDO rail ramp up. Holding control signal 116 at logic low has the effect of holding output signal 110 of level shifting circuit 106 at logic low by suppressing the output voltage of level shifting circuit 106. For example, the voltage level of output signal 110 is suppressed, or sunk, to logic low while control signal indicates logic low. Thus, control signal 116 limits the output of the level shifting circuit 106 such that the level shifted signal will not increase to a voltage that will register as a logic high at secondary device 104. Because level shifting circuit 106 is prevented from generating a logic high on output signal 110, the glitch cannot occur during a ramp up of VDDO 122.

Once VDDO 122 has completed ramp up, control circuit 118 can enable level shifting circuit 106 for normal operation by asserting control signal 116 to logic high. In some examples, control circuit 118 detects that VDDO 122 has completed ramp up by utilizing a timer or counter to set the control signal 116 to a logic high value after a preset time or interval has elapsed. Once control signal 116 is set to logic high, output signal 110 will toggle between logic levels in accordance with input signal 108. In some examples, control signal 116 is maintained at logic high until another boot or reset event occurs in which VDDO 122 must be powered up again. Although the examples described herein use a logic low on the control signal to suppress the voltage level of the output signal 110, it will be readily appreciated that logic levels used by the control signal could be reversed by omitting or adding an inverter, or by switching an n-channel transistor to a p-channel transistor, and so on.

Figure 2:
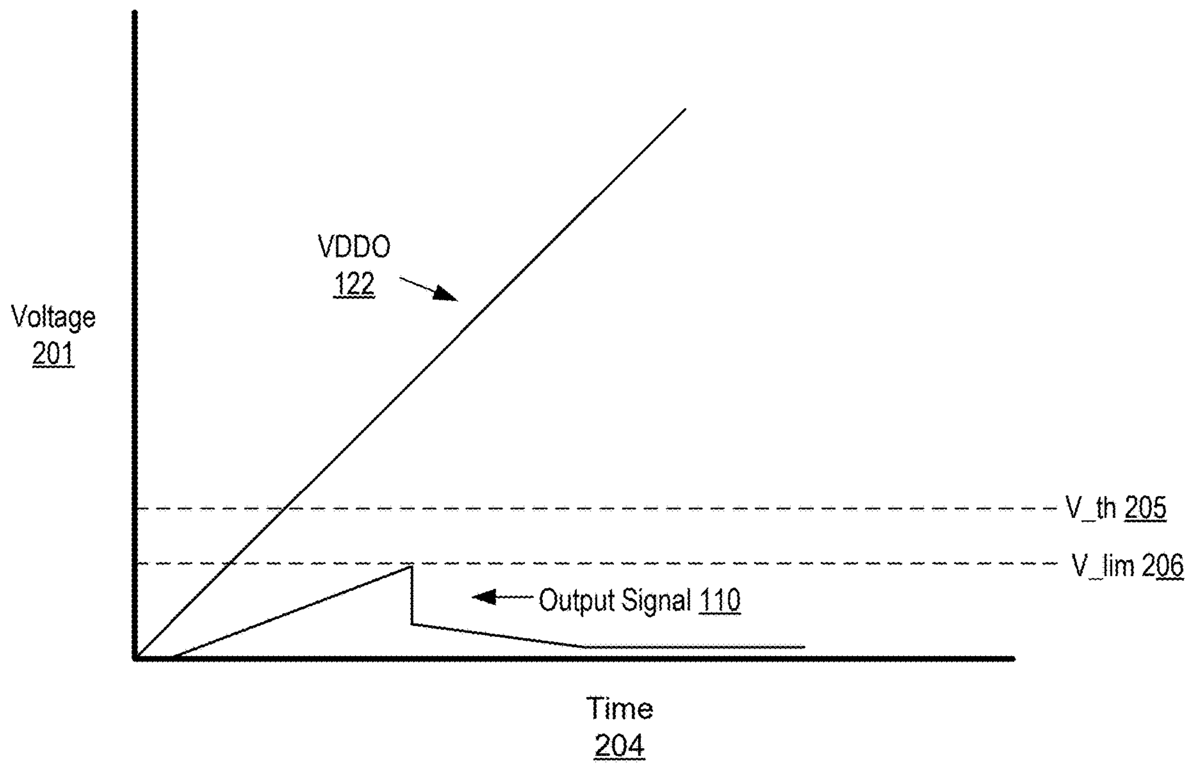
FIG. 2 illustrates an example graph of supply voltage and output signal voltage in voltage vs. time for a level shifting circuit configured in accordance with one or more embodiments of the present disclosure.

For further explanation, FIG. 2 illustrates an example graph of voltage 201 vs. time 204 of rail voltage VDDO 122 and the output signal 110 of level shifting circuit 106 in FIG. 1. In this example, an input signal 108 (not shown here) to the level shifting circuit is held at logic low and thus the output signal 110 should also be logic low. In FIG. 2, V_th indicates the threshold voltage for logic high. FIG. 2 shows that, as VDDO 122 is increasing, output signal 110 is limited to a maximum voltage of V_lim 206 before correcting to a substantially zero voltage. Because V_lim 206 is less than V_th 205, output signal 110 will not be interpreted as logic high by a device receiving output signal 110. The control signal limits the glitch by suppressing the output voltage of the level shifting circuit to logic low as VDDO 122 is increasing. When the ramp up of VDDO 122 is complete, the suppression is discontinued and output signal 110 is allowed to toggle between logic levels in accordance with input signal 108.

Figure 3:
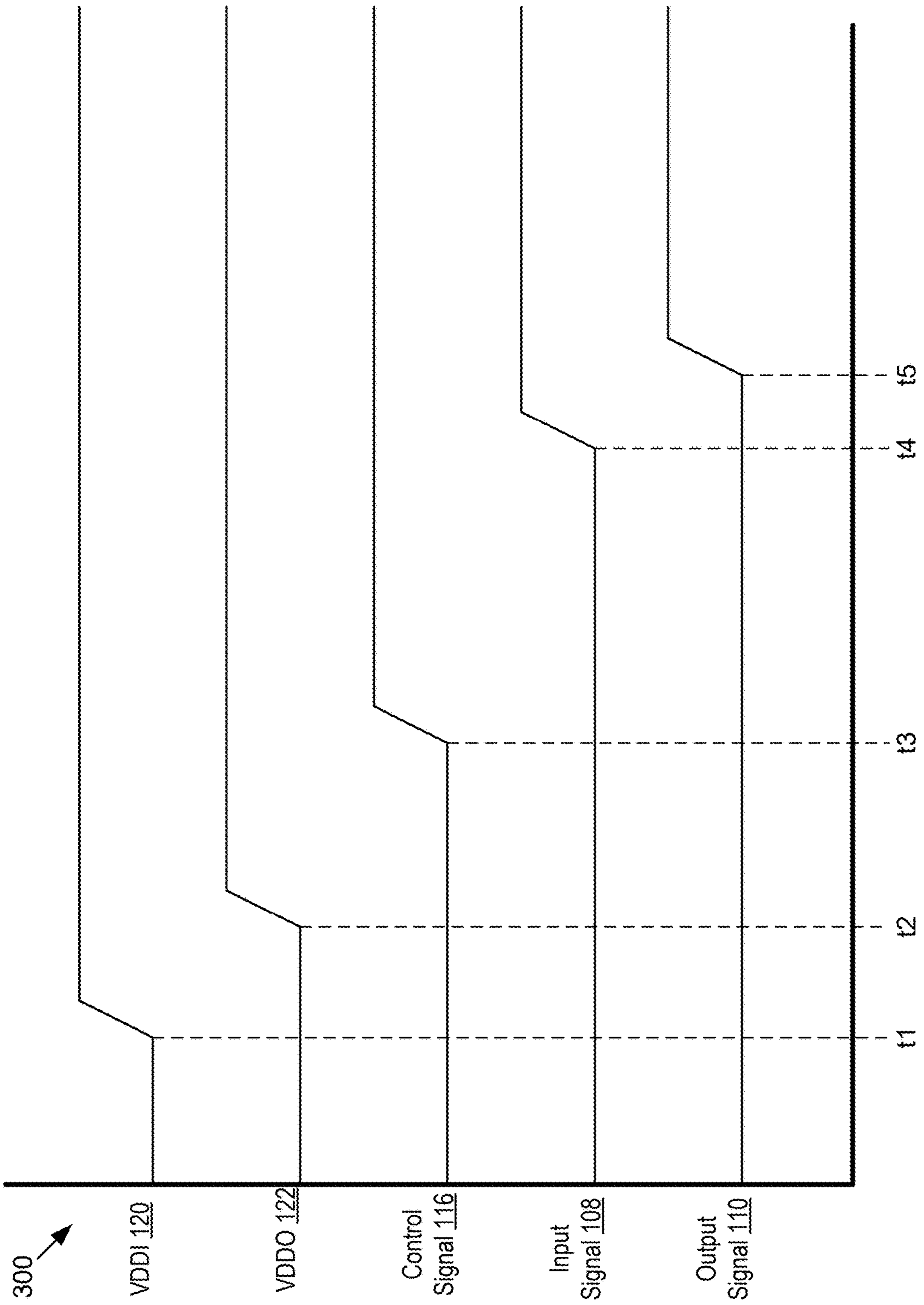
FIG. 3 illustrates an example waveform of signal logic levels of a level shifting circuit configured in accordance with one or more embodiments of the present disclosure.

For further explanation, FIG. 3 sets forth a waveform diagram 300 of example logic levels for VDDI 120, VDDO 122, input signal 108, and output signal 110 in the level shifting circuit 106 of FIG. 1. As can be seen in FIG. 3, at time t1, power is supplied to the VDDI rail and VDDI 120 transitions from 0V to a preset voltage indicating a logic high in the first voltage domain. At time t2, while the VDDI rail is powered up, the power is supplied to the VDDO rail and VDDO 122 transitions from 0V to a preset voltage indicating a logic high in the second voltage domain. While VDDO 122 is ramping up, primary device 102 holds input signal 108 constant at logic low and holds control signal 116 at logic low. As discussed, control signal 116 has the effect of restraining or limiting the voltage level of output signal 110, such that output signal 110 never reaches logic high. At time t3, after the VDDO rail is powered up and VDDO 122 is at full potential, control signal 116 is asserted to logic high. Subsequently, at time t4, when input signal 108 transitions to logic high as part of an output of primary device 102, a corresponding logic high is generated on output signal 110 at time t5.

Figure 4:
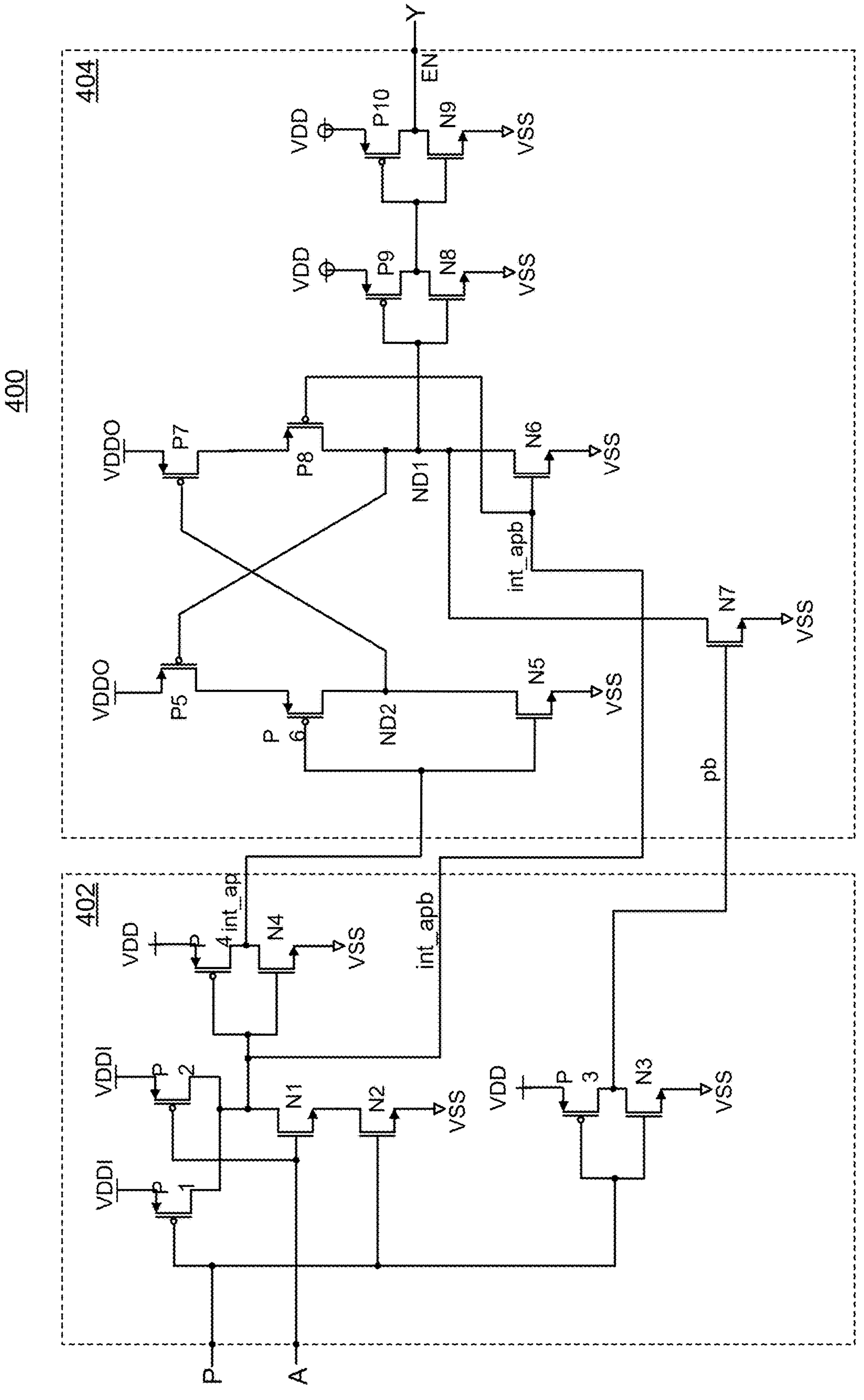
FIG. 4 illustrates a circuit diagram of an example level shifting circuit configured in accordance with one or more embodiments of the present disclosure.

FIG. 4 illustrates an example level shifting circuit 400 for glitch suppression in a level shifting circuit during power up in accordance with one or more embodiments of the present disclosure. Level shifting circuit 400 may be an example of level shifting circuit 106 illustrated in FIG. 1. Level shifting circuit 400 transmits signals from a first voltage domain VDDI (e.g., an input voltage domain) to a second voltage domain VDDO (e.g., an output voltage domain). In the example of FIG. 4, level shifting circuitry 400 includes a first stage 402 and a second stage 404. In a particular embodiment, first stage 402 and second stage 404 are integrated in a single IC (integrated circuit) coupling a device operating in a first voltage domain VDDI to a device operating in a second voltage domain VDDO. In another embodiment, first stage 402 is implemented as component of a device operating in the first voltage domain VDDI, such as primary device 102 in FIG. 1, while the second stage is implemented as a component of a separate device operating in the second voltage domain VDDO, such as secondary device 104 in FIG. 1. In the example of FIG. 4, the level shifting circuit 400 receives a signal A and outputs a level-shifted signal Y that is effectively signal A but in the VDDO voltage domain.

First stage 402 of level shifting circuit 400 receives an input signal A (e.g., corresponding to input signal 108 in FIG. 1) and a control signal P (e.g., corresponding to control signal 116 in FIG. 1). First stage 402 includes p-channel type transistors (e.g., PFETs, PMOS FETs) that are identified in FIG. 4 as P1 to P4 and n-channel type transistors (e.g., NFETs, NMOS FETs) that are identified in FIG. 4 as N1 to N4. In some examples, transistors P1, P2, N1, and N2 form a two-input NAND gate that receives signal A and control signal P, and outputs signal int_apb. In some examples, transistors P4 and N4 implement an inverter that inverts signal int_apb to generate signal int_ap. Transistors P3 and N3 implement an inverter that inverts control signal P to generate signal pb. Thus, when control signal P is logic low, output signal int_ap is held at logic low.

Second stage 404 of level shifting circuitry 400 receives signal int_ap, signal int_apb, and signal pb. Signals int_ap and int_apb are applied to a level shifting transistor network that includes transistors N5, N6, P5, P6, P7, P8. The level shifting transistor network is driven by signal int_ap and int_apb and outputs a level shifted signal in the VDDO voltage domain at node ND1. When int_ap transitions from low to high as signal A transitions from low to high, N5 is activated and begins discharging node ND2. P6 is also deactivated by the transition, isolating the node ND2 from P5. As the node ND2 discharges, P7 activates and begins charging node ND1 to the VDDO supply voltage (P8 is also activated, and N6 is deactivated, by the transition to low int_apb due to the transition high of signal A). Accordingly, node ND1 results in the same logical state as signal A, at the VDDO supply voltage. When signal A transitions from high to low, int_apb transitions from low to high and N6 is activated. N6 begins discharging the node ND2. P8 is also deactivated by the int_apb transition, isolating the node ND1 from P7. Thus, the node ND1 is discharged to VSS (ground). As the node ND1 discharges, P5 activates and begins charging node ND2 to the VDDO supply voltage (P6 is also activated by the transition of signal A to low), thus deactivating N5. P6 and P8 may limit power dissipation during transition, by isolating the node ND1 and node ND2, respectively, from P5 and P7, respectively. P5 and P7 may be delayed in deactivating with respect to the activation of N5 and N6, respectively, since P5 and P7 are deactivated through the charging of nodes ND1 and ND2. Although an example topology of the level shifting is shown in FIG. 4, it will be appreciated that other level shifting topologies can be used.

In accordance with embodiments of the present disclosure, second stage 404 also includes transistor N7 that is coupled between node ND1 and VSS, which acts as a gating transistor, or an 'output suppressing transistor,' for the output signal of the level shifting circuit 400. Transistor N7 is gated by signal pb. Accordingly, when control signal P is logic low and thus signal pb is logic high, transistor N7 is turned on and pulls node ND1 to VSS, i.e., logic low. The level shifted output at node ND1 is inverted by transistors P9 and N8, and that output is inverted again by transistors P10 and N9, the output of which is provided as level shifted output signal Y. Thus, it can be recognized that a primary device in the first voltage domain uses control signal P to ensure that, during the powering-up of rail voltage in the first and second domain, the output of the level shifting circuit will not experience a glitch as described above. Therefore, a secondary device receiving the output signal in the second voltage domain device will not read an incorrect value. After rail powerup completes, control signal P can be asserted to logic high, and signal Y will toggle as signal A toggles.

Figure 5A:
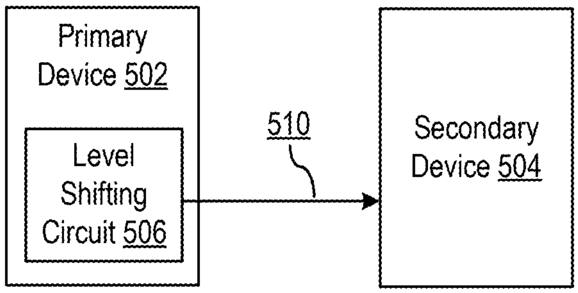
FIG. 5A illustrates a block diagram of an example configuration for a level shifting circuit in accordance with one or more embodiments of the present disclosure.

For further explanation, FIGS. 5A-8D set forth different implementations of a level shifting circuit for glitch suppression in a level shifting circuit during power up in accordance with the present disclosure. In the example of FIG. 5A, primary device 502 and second device 504 may be different logic blocks of an SoC, different dies of an SiP, and so on. In this example, the level shifting circuit 506 is integrated in primary device 502. The output signal 510 of the level shifting circuit 506 is provided from the primary device 502 to the secondary device 504.

Figure 5B:
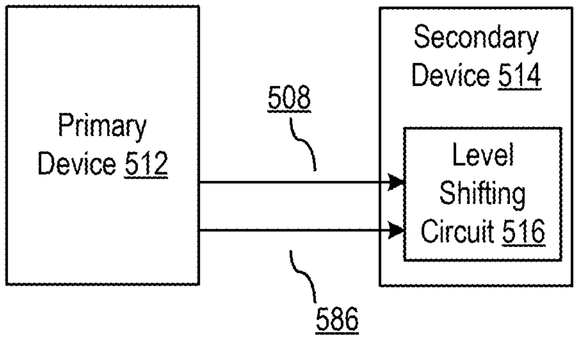
FIG. 5B illustrates a block diagram of another example configuration for a level shifting circuit in accordance with one or more embodiments of the present disclosure.

In the example of FIG. 5B, primary device 512 and secondary device 514 may be different logic blocks of an SoC, different dies of an SiP, and so on. In this example, the level shifting circuit 516 is integrated in secondary device 514. Primary device 512 provides input signal 508 and control signal 586 to level shifting circuit 516 in secondary device 514.

Figure 5C:
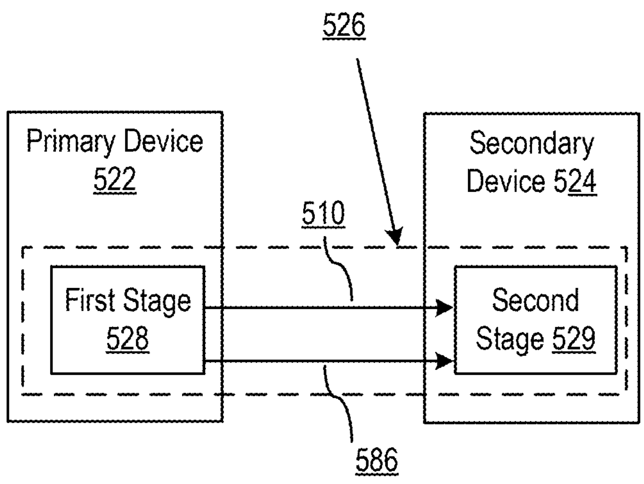
FIG. 5C illustrates a block diagram of another example configuration for a level shifting circuit in accordance with one or more embodiments of the present disclosure.

In the example of FIG. 5C, primary device 522 and secondary device 524 may be different logic blocks of an SoC, different dies of an SiP, and so on. In this example, the level shifting circuit 526 is distributed between primary device 522 and secondary device 524. For example, as explained with reference to FIG. 4, level shifting circuit 526 may be comprised of two stages. In this example, first stage 528 is integrated in first device 522 and second stage 529 is integrated in second device 524. First stage 528 in primary device provides input signal 508 and control signal 586 to second stage 529 in secondary device 524.

Figure 5D:
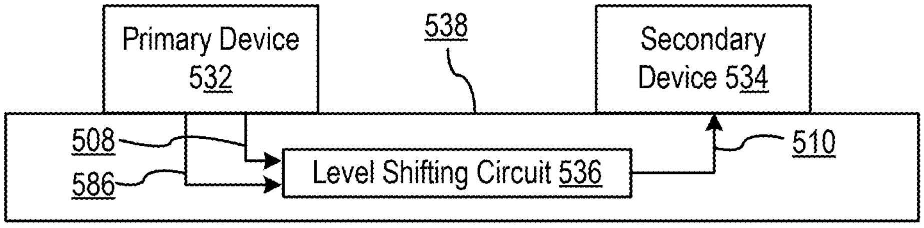
FIG. 5D illustrates a block diagram of another example configuration for a level shifting circuit in accordance with one or more embodiments of the present disclosure.

In the example of FIG. 5D, primary device 532 and secondary device 534 may be different dies mounted on a common substate 538 or interposer. In this example, level shifting circuit 536 can be implemented in or on substrate 538. For example, level shifting circuit 536 can be a bridge circuit embedded in substrate 538 and coupling primary device 532 to secondary device 534. Primary device 532 provides input signal 508 and control signal 586 to level shifting circuit 536 through signal pathways in substrate 538, and level shifting circuit 536 provides output signal 510 to primary device 534 through signal pathways in substrate 538.

Figure 6:
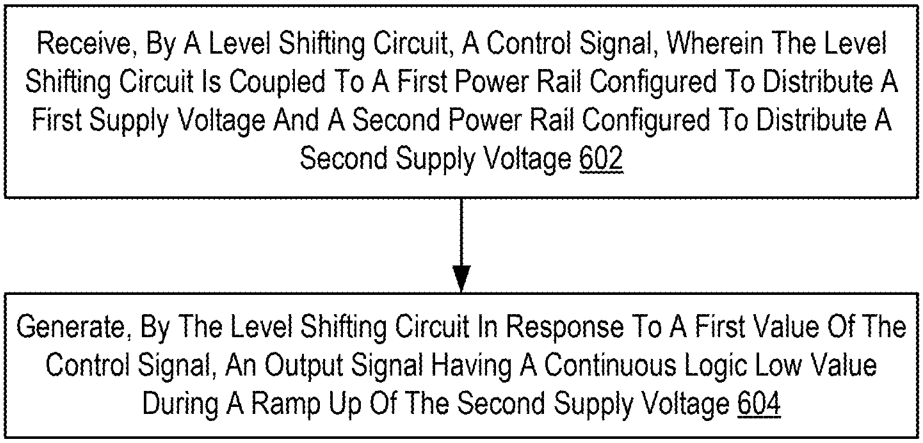
FIG. 6 sets forth a flow chart of an example method for glitch suppression in a level shifting circuit during power up in accordance with the one or more embodiments of the present disclosure.

For further explanation, FIG. 6 sets forth an example method of glitch suppression in a level shifting circuit during power up in accordance with the present disclosure. The method of FIG. 6 includes receiving 602, by a level shifting circuit, a control signal, wherein the level shifting circuit is coupled to a first power rail configured to distribute a first supply voltage and a second power rail configured to distribute a second supply voltage. In some examples, the level shifting circuit is implemented by any of the level shifting circuits described above with reference to FIGS. 1-4. In these examples, the level shifting circuit receives 602 the control signal as described above with reference to FIGS. 1-4. For example, the level shifting circuit receives 602 the control signal from a control circuit. In some implementations, the control circuit is coupled to or included within a power management circuit that controls the second supply voltage. The level shifting circuit is configured to convert an input signal received in a first voltage domain to an output signal in a second voltage domain. To do so, the level shifting circuit utilizes both the first supply voltage of the first voltage domain and the second supply voltage of the second voltage domain. Thus, the output signal is generated using the supply voltage of the second voltage domain, while the input signal is generated using the supply voltage of the first voltage domain. In some examples, the control signal is generated using the supply voltage of the first voltage domain.

The method of FIG. 6 also includes generating 604, by the level shifting circuit in response to detecting a first value of the control signal, an output signal having a continuous logic low value during a ramp up of the second supply voltage. In some examples, the level shifting circuit generates 604 the output signal having a continuous logic low value as described above with reference to FIG. 1 to FIG. 4. It is noted that a signal with a continuous logic low value refers to a signal that may be interpreted continuously by a receiving device as a logic low value regardless of the actual voltage level of the signal. That is, in the example of FIG. 6, the output signal may increase a small amount from 0V, but due to the control signal, the voltage level will be suppressed under a threshold value at which a device receiving the output signal could interpret the voltage level as a logic high.

The level shifting circuit may detect a first value of the control signal by detecting a logic low value. Detecting a logic low value can be carried out by detecting that a voltage level of the control signal is below a threshold voltage level. This value is received during a ramp up of the second supply voltage as the voltage on the second power rail ramps up from 0V to the second supply voltage. The output of the level shifting circuit is generated as a continuous logic low value based on the control signal, which is operable to restrain the output signal to logic low without any voltage spike in the output signal that could transiently cause a voltage level indicating logic high on the output signal. In some implementations, the control signal is used to gate a transistor that is coupled to an output node in the level shifting circuit. When the control signal indicates a logic low value, a transistor in the level shifting circuit couples the output node to ground, thus suppressing the voltage on the output node. In this way, a glitch in the output signal of the level shifting circuit is prevented.

Figure 7:
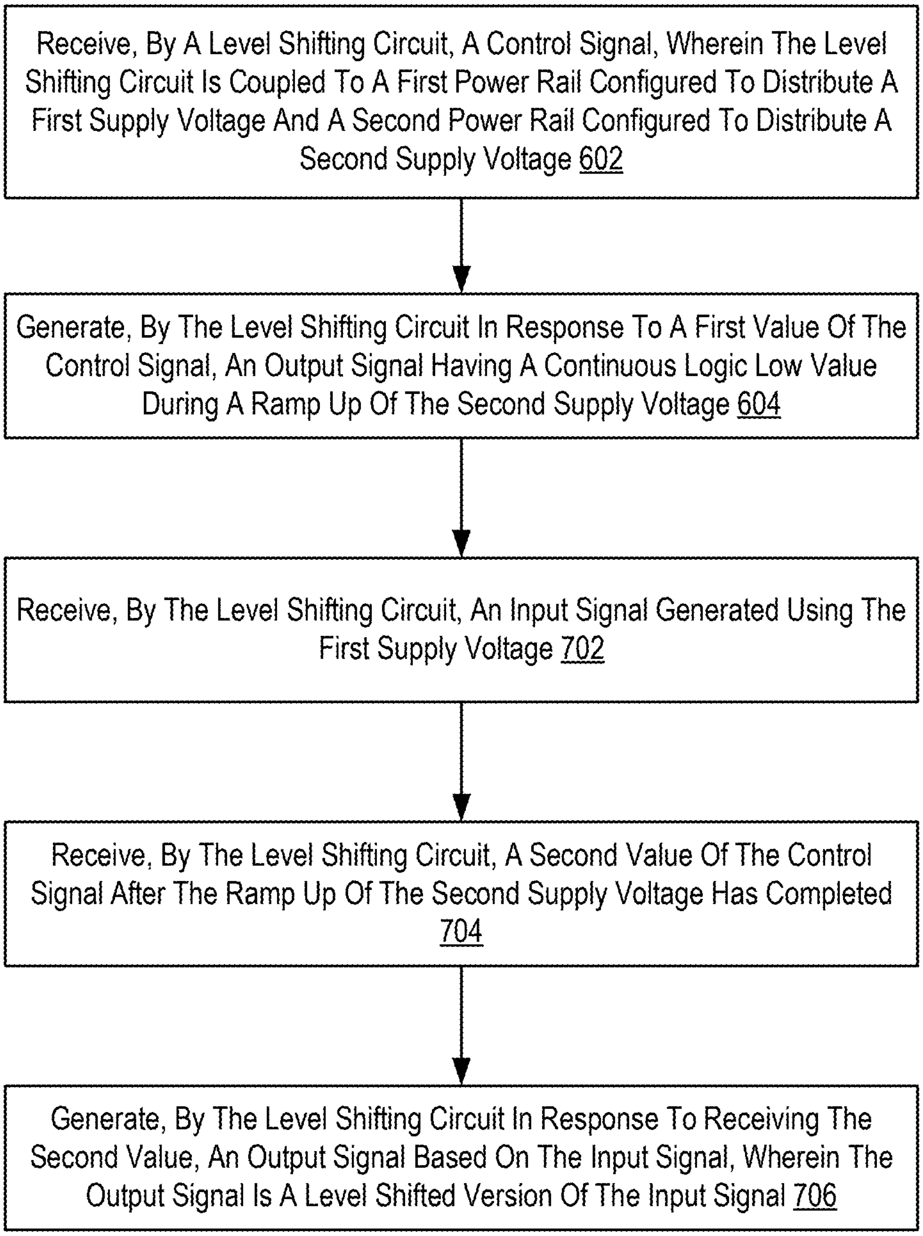
FIG. 7 sets forth a flow chart of another example method for glitch suppression in a level shifting circuit during power up in accordance with one or more embodiments of the present disclosure.

For further explanation, FIG. 7 sets forth another example method of glitch suppression in a level shifting circuit during power up in accordance with the present disclosure. The method of FIG. 7 extends the method of FIG. 6 in that the method of FIG. 7 also includes receiving 702, by the level shifting circuit, an input signal generated using the first supply voltage. In some examples, the level shifting circuit receives 702 an input signal from a first device that is operating on the first supply voltage as described above with reference to FIG. 1 to FIG. 4. The first device generates a signal for communication with a second device operating on the second supply voltage. This signal is provided as an input to the level shifting circuit to convert the input signal to a level that is compatible with the second device.

The method of FIG. 7 also includes detecting 704, by the level shifting circuit, a second value of the control signal after the ramp up of the second supply voltage has completed. In some examples, the level shifting circuit detects 704 the second value of the control signal after the ramp up of the second supply voltage has completed as described above with reference to FIG. 1 to FIG. 4. For example, the level shifting circuit detects the second value by detecting a logic high value on the control signal. Detecting a logic high value can be carried out by detecting that a voltage level of the control signal is above a threshold voltage level for a high logic value. This value of the control signal is generated by the control circuit only after the ramp up of the second supply voltage has completed.

The method of FIG. 7 also includes generating 706, by the level shifting circuit in response to detecting the second value, an output signal based on the input signal, wherein the output signal is a level shifted version of the input signal. In some examples, the level shifting circuit generates 706 the output signal based on the input signal as described above with reference to FIG. 1 to FIG. 4. For example, in response to detecting the second value, the voltage level of the output signal of the level shifting circuit is no longer suppressed and is permitted to toggle in accordance with the input signal. In some examples, when the control signal is set to logic high, the transistor that is used to suppress the output voltage by coupling the output node to ground is turned off.

Figure 8:
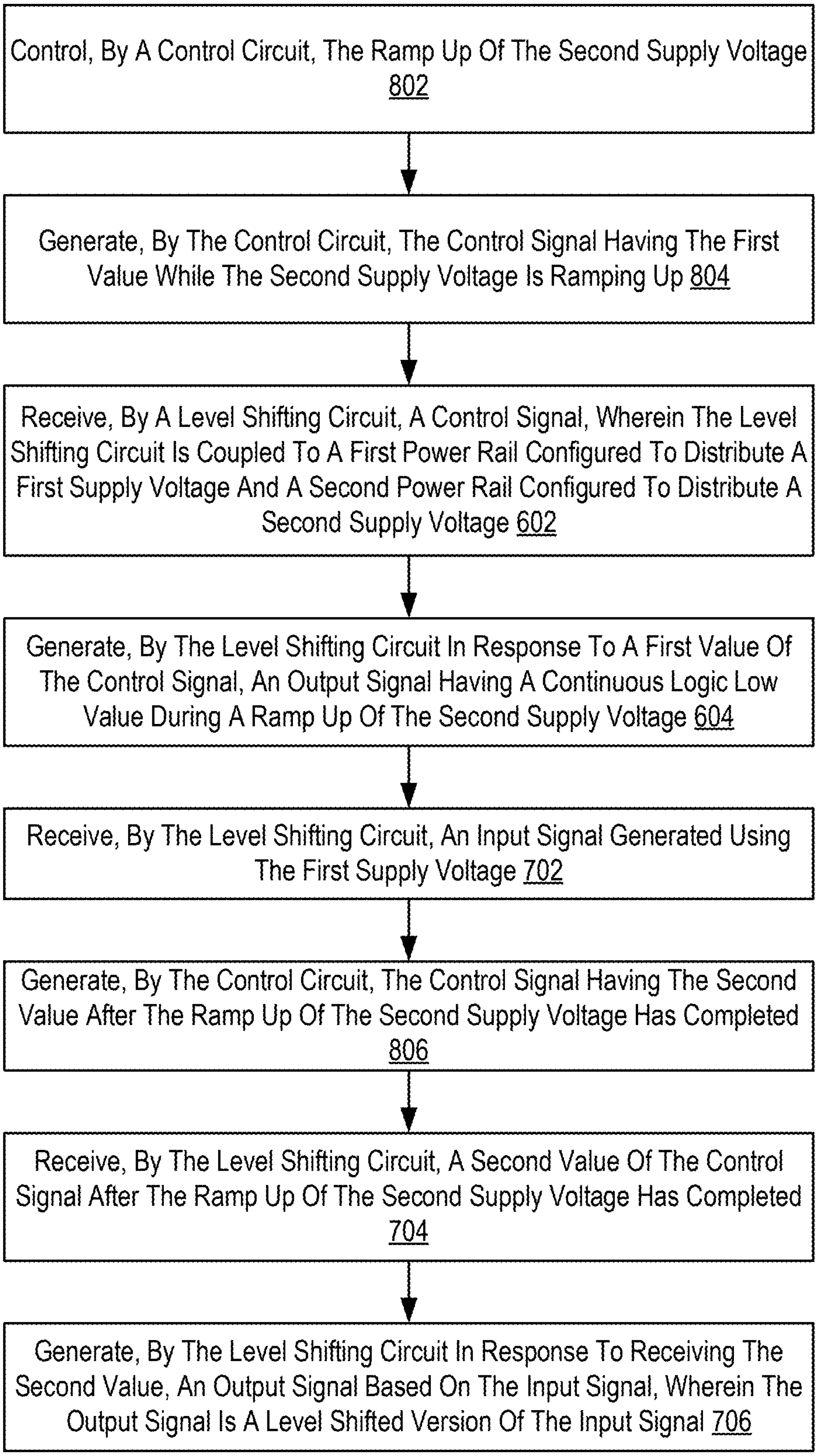
FIG. 8 sets forth a flow chart of another example method for glitch suppression in a level shifting circuit during power up in accordance with one or more embodiments of the present disclosure.

For further explanation, FIG. 8 sets forth another example method of glitch suppression in a level shifting circuit during power up in accordance with the present disclosure. The method of FIG. 8 extends the method of FIG. 7 in that the method of FIG. 8 also includes controlling 802, by a control circuit, the ramp up of the second supply voltage. In some examples, the control circuit controls 802 the second supply voltage as discussed above with reference to FIG. 1 to FIG. 4. For example, the control circuit can be a power management circuit that controls when the second supply voltage is supplied to the second power rail. Thus, the control circuit knows when the second supply voltage begins ramping up.

The method of FIG. 8 also includes generating 804, by the control circuit, the control signal having the first value while the second supply voltage is ramping up. In some examples, the control circuit generates 804 the control signal having the first value as described above in FIG. 1 to FIG. 4. For example, the control circuit generates 804 the first value on the control signal by setting the control signal to a logic low value. The control circuit sets the control signal to logic low prior to initiating the ramp up of the second supply voltage.

The method of FIG. 8 also includes generating 806, by the control circuit, the control signal having the second value after the ramp up of the second supply voltage has completed. In some examples, the control circuit generates 806 the control signal having the second value as described above with reference to FIG. 1 to FIG. 4. For example, the control circuit generates the second value by setting the control signal to a logic high value. In some examples, the control circuit determines that the ramp up of the second supply voltage has completed by using a timer or counter to determine that a predetermined ramp up period has elapsed, where the ramp up period is the amount of time or cycles it takes for the second power rail to transition from 0V to the full second supply voltage. For example, a counter can be configured to count a predetermined number of cycles corresponding to the ramp up period. The counter begins counting when the ramp up of the second supply voltage is initiated. In other examples, the control circuit can determine that the ramp up of the second supply voltage has completed by measuring the voltage on the second power rail.

Figure 9:
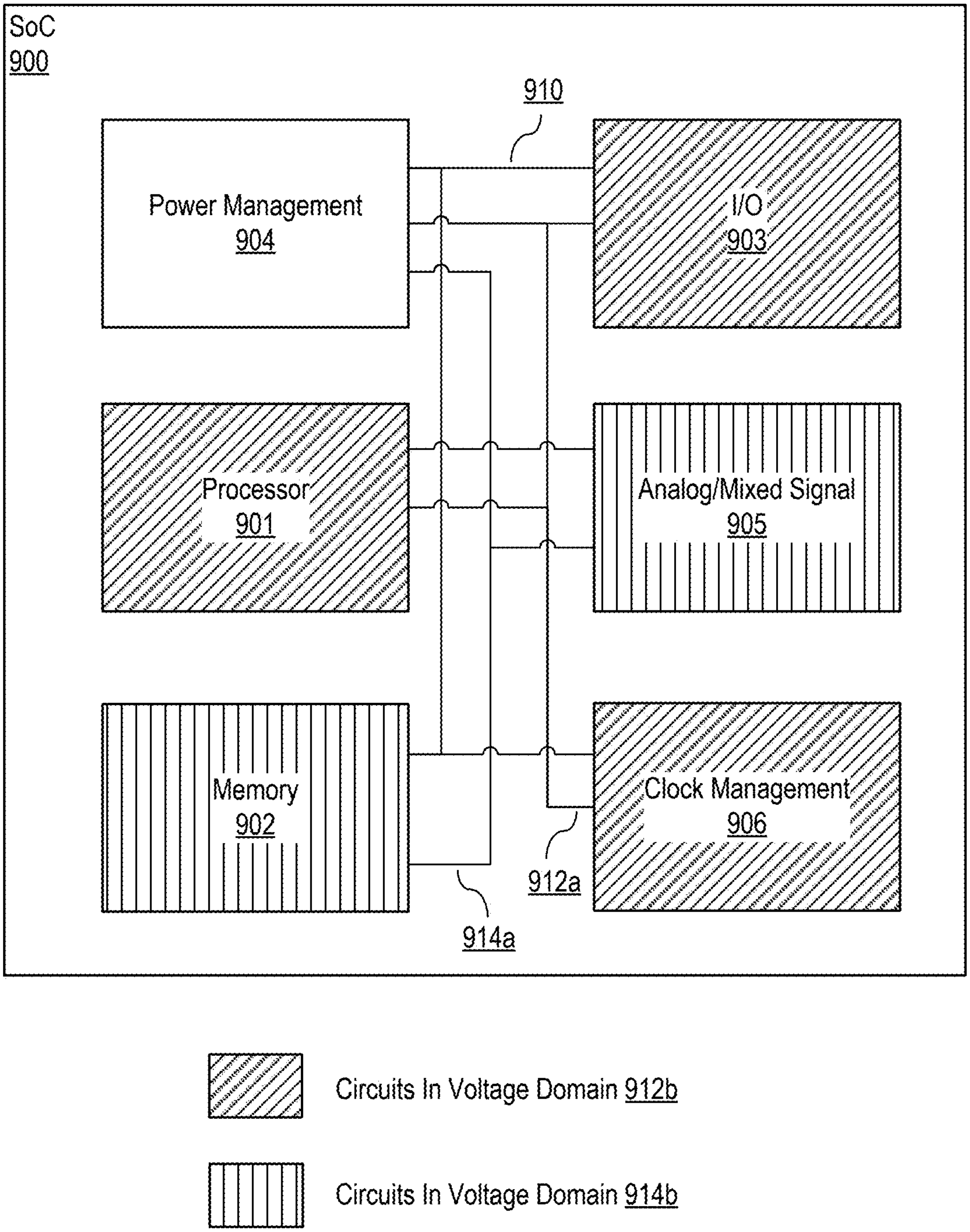
FIG. 9 illustrates a block diagram of an example computing environment in accordance with one or more embodiments of the present disclosure.

FIG. 9 illustrates a block diagram of an example SoC 900, in accordance with one or more embodiments of the present disclosure. SoC 900 includes processor 901 coupled to memory block 902, I/O block 903, power management unit 904, analog/mixed-signal block 905, clock management unit 906, all coupled through system bus 910. Additionally, power management unit 904 may provide a power 912*a* to a first set of the circuit blocks in SoC 900 and power 914*a* to a second set of the circuit blocks. In various embodiments, SoC 900 may be configured for use in a mobile computing application such as, e.g., a tablet computer, smartphone or wearable device. In some examples, a level shifting circuit, such as level shifting circuit 106 in FIG. 1 or level shifting circuit 400 in FIG. 4, provides an interface between processor 901 and one or more other blocks. For example, processor 901 may interface with memory block 902 or I/O block 903 through a level shifting circuit in accordance with embodiments of the present disclosure. In some examples, power supply management unit 904 provides different supply voltages according to different voltage domains to such a level shifting circuit.

Processor 901 may, in various embodiments, be representative of a general-purpose processor that performs computational operations. For example, processor 901 may be a central processing unit (CPU) such as a microprocessor, a microcontroller, an application-specific integrated circuit (ASIC), or a field-programmable gate array (FPGA). In some embodiments, Processor 901 may include multiple CPU cores and may include one or more register files and memories. In various embodiments, processor 901 may implement any suitable instruction set architecture (ISA), such as, e.g., PowerPC™, ARM®, or x86 ISAs, or combination thereof.

Memory block 902 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM). Some embodiments may include a single memory, such as memory block 902 and other embodiments may include more than two memory blocks (not shown). memory block 902, may, in some embodiments, include a memory controller for interfacing to memory external to SoC 900, such as, for example, one or more DRAM chips.

I/O block 903 may be configured to coordinate data transfer between SoC 900 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O block 903 may include general-purpose input/output pins (I/O pins). In some embodiments, I/O block 903 may be configured to implement a version of Universal Serial Bus (USB) protocol, IEEE-11394 (Firewire) protocol, or Ethernet (IEEE-802.3) networking protocol.

Power management unit 904 may be configured to manage power delivery to some or all of the circuit blocks included in SoC 900. Power management unit 904 may include sub-blocks for managing multiple power supplies for various circuit blocks. In various embodiments, the power supplies may be located in analog/mixed-signal block 905, in power management unit 904, in other blocks within SoC 900, or come from a source external to SoC 900 and coupled through power supply pins. Power management unit 904 may include one or more voltage regulators to adjust outputs of the power supplies to various voltage levels as required by circuit blocks in SoC 900, such as for reduced power modes, for example.

In the illustrated embodiment, power management unit 904 supplies power 912*a* to processor 901, I/O block 903, and clock management unit 906. These circuit blocks are in voltage domain 912*b*. Power management unit 904 supplies power 914*a* to memory block 902 and analog/mixed-signal block 905, putting these circuit blocks in voltage domain 914*b*. If a voltage level of power 912*a* is different than a voltage level of power 914*a*, then logic signals transmitted via system bus 910 from a circuit block in the power 912*a* voltage domain may need to be level shifted before being received by a circuit block in the power 914*a* voltage domain.

Analog/mixed-signal block 905 may include a variety of circuits including, for example, a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in analog/mixed-signal block 905. In some embodiments, analog/mixed-signal block 905 may also include radio frequency (RF) circuits that may be configured for operation with cellular telephone networks. Analog/mixed-signal block 905 may include one or more voltage regulators to supply one or more voltages to various circuit blocks and circuits within those blocks.

Clock management unit 906 may be configured to enable, configure and monitor outputs of one or more clock sources. In various embodiments, the clock sources may be located in analog/mixed-signal block 905, within clock management unit 906, in other blocks within SoC 900, or come from external to SoC 900, coupled via one or more I/O pins. Clock management unit 906 may include circuits for selecting an output frequency or reference clock of a PLL, FLL, DLL, or other type of closed-loop clock source.

System bus 910 may be configured as one or more buses to couple processor 901 to the other circuit blocks within the SoC 900 such as, e.g., memory block 902 and I/O block 903. In some embodiments, system bus 910 may include interfaces coupled to one or more of the circuit blocks that allow a particular circuit block to communicate through the bus. In some embodiments, system bus 910 may allow movement of data and transactions (i.e., requests and responses) between circuit blocks without intervention from processor 901. For example, data received through the I/O block 903 may be stored directly to memory block 902.

It is noted that the SoC illustrated in FIG. 9 is merely an example SoC. In other embodiments, different circuit blocks and different configurations of circuit blocks may be possible dependent upon the specific application for which the SoC is intended.

Figure 10:
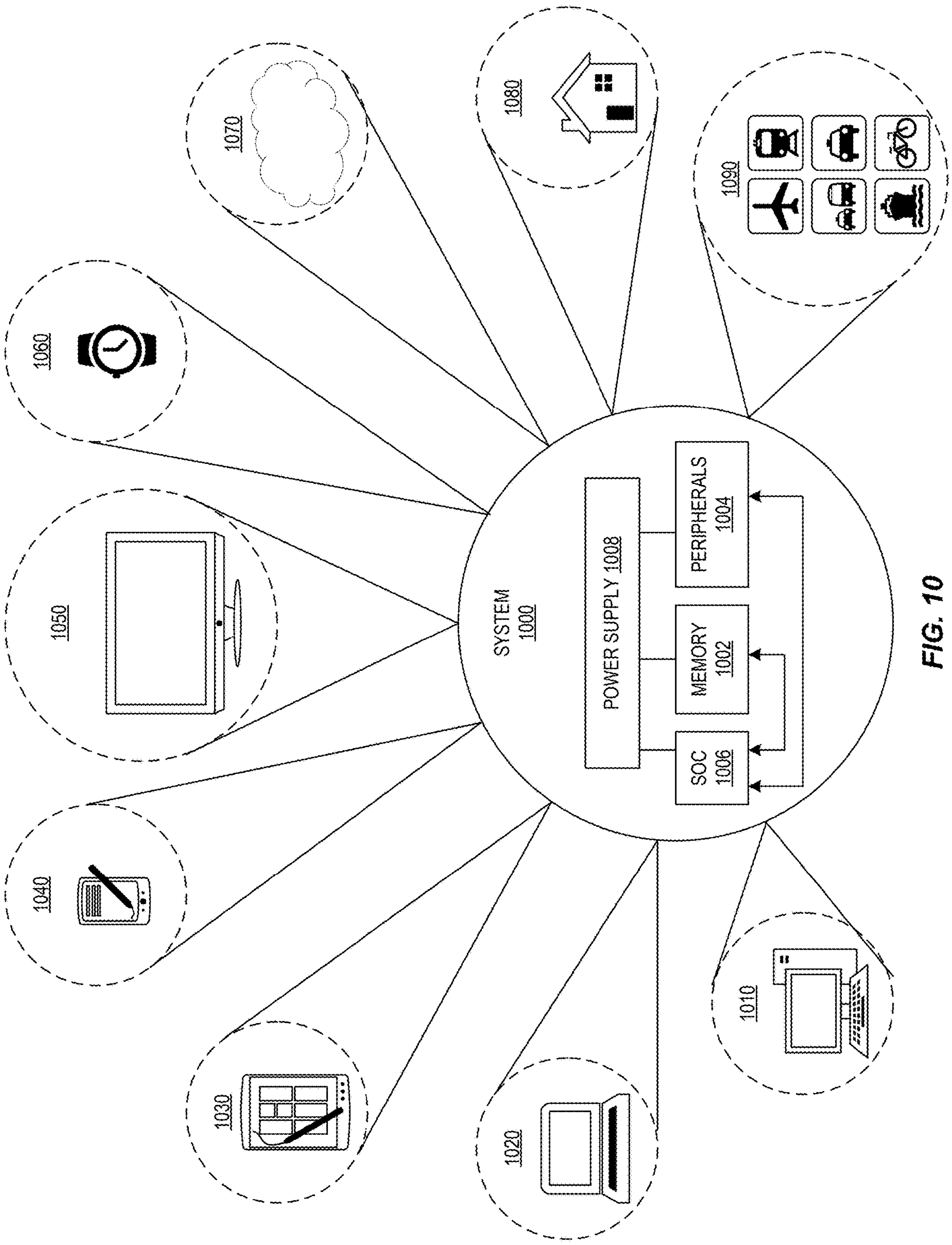
FIG. 10 illustrates a block diagram of an example system in accordance with one or more embodiments of the present disclosure.

FIG. 10 illustrates a block diagram of an example system 1000, in accordance with one or more embodiments of the present disclosure. The system 1000 may incorporate and/or otherwise utilize the circuits, devices, components, methods, functions, and/or mechanisms described herein. In the illustrated embodiment, the system 1000 includes at least one instance of a system on chip (SoC) 1006 which may include multiple types of processing units, such as a central processing unit (CPU), a graphics processing unit (GPU), or otherwise, a communication fabric, and interfaces to memories and input/output devices. In some embodiments, one or more processors in SoC 1006 includes multiple execution lanes and an instruction issue queue. In various embodiments, SoC 1006 is coupled to external memory 1002, peripherals 1004, and power supply 1008. The system 1000 may use plates (with regions and/or vias) that are coupled to various components (e.g., coupled to SoC 1006).

A power supply 1008 is also provided which supplies the supply voltages to SoC 1006 as well as one or more supply voltages to the external memory 1002 and/or the peripherals 1004. In various embodiments, power supply 1008 represents a battery (e.g., a rechargeable battery in a smart phone, laptop or tablet computer, or other devices). In some embodiments, more than one instance of SoC 1006 is included (and more than one external memory 1002 is included as well).

The external memory 1002 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1004 include any desired circuitry, depending on the type of system 1000. For example, in one embodiment, peripherals 1004 includes devices for various types of wireless communication, such as Wi-Fi, Bluetooth, cellular, global positioning system, etc. In some embodiments, the peripherals 1004 also include additional storage, including RAM storage, solid state storage, or disk storage. The peripherals 1004 include user interface devices such as a display screen, including touch display screens or multitouch display screens, keyboard or other input devices, microphones, speakers, etc.

As illustrated, system 1000 is shown to have application in a wide range of areas. For example, system 1000 may be utilized as part of the chips, circuitry, components, etc., of a desktop computer 1010, laptop computer 1020, tablet computer 1030, cellular or mobile phone 1040, or television 1050 (or set-top box coupled to a television). Also illustrated is a smartwatch and health monitoring device 1060. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1000 may further be used as part of a cloud-based service(s) 1070. For example, the previously mentioned devices, and/or other devices, may access computing resources in the cloud (i.e., remotely located hardware and/or software resources). Still further, system 1000 may be utilized in one or more devices of a home 1080 other than those previously mentioned. For example, appliances within the home 1080 may monitor and detect conditions that warrant attention. For example, various devices within the home 1080 (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 10 is the application of system 1000 to various modes of transportation 1090. For example, system 1000 may be used in the control and/or entertainment systems of aircraft, trains, buses, cars for hire, private automobiles, waterborne vessels from private boats to cruise liners, scooters (for rent or owned), and so on. In various cases, system 1000 may be used to provide automated guidance (e.g., self-driving vehicles), general systems control, and otherwise. These any many other embodiments are possible and are contemplated. It is noted that the devices and applications illustrated in FIG. 10 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—an entity configured to perform one or more tasks—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S. C. § 112, paragraph (f) interpretation for that unit/circuit/component. More generally, the recitation of any element is expressly intended not to invoke 35 U.S. C. § 112, paragraph (f) interpretation for that element unless the language "means for" or "step for" is specifically recited. Should Applicant wish to invoke Section 112(f) during prosecution of a United States patent application based on this disclosure, it will recite claim elements using the "means for" performing a function construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A level shifting circuit comprising:

a set of first voltage domain transistors that utilize a first supply voltage, the set of first voltage domain transistors including:

a NAND gate configured to receive an input signal and a control signal and generate a first voltage domain signal based on the input signal and the control signal;

a first inverter configured to generate a complement of the first voltage domain signal; and a second inverter configured to generate a complement of the control signal; and a set of second voltage domain transistors that utilize a second supply voltage, the set of second voltage domain transistors including:

a network of transistors configured to generate, at an output node, a second voltage domain signal based on the first voltage domain signal and a complement of the first voltage domain signal; and an output suppressing transistor configured to couple the output node to ground based on the complement of the control signal.

2. The level shifting circuit of claim 1, wherein the network of transistors includes:

a first n-channel transistor coupled between a first node and ground, the first n-channel transistor being gated by the first voltage domain signal;

a first p-channel transistor coupled between the first node and a second p-channel transistor, the first p-channel transistor being gated by the first voltage domain signal;

the second p-channel transistor coupled between the second supply voltage and the first p-channel transistor, the second p-channel transistor being gated by the output node;

a second n-channel transistor coupled between the output node and ground, the second n-channel transistor being gated by the complement of the first voltage domain signal;

a third p-channel transistor coupled between the output node a fourth p-channel transistor, the third p-channel transistor being gated by the complement of the first voltage domain signal; and the fourth p-channel transistor coupled between the second supply voltage and the third p-channel transistor, the fourth p-channel transistor being gated by the first node.

3. The level shifting circuit of claim 1, wherein the output suppressing transistor is an n-channel transistor coupled between the output node and ground, wherein a gate of the output suppressing transistor is coupled to the complement of the control signal.

4. The level shifting circuit of claim 1, wherein the output node is pulled to ground while the control signal has a logic low value; and wherein a voltage of the output node, toggles according to the input signal while the control signal has a logic high value.

5. An apparatus comprising:

a first power rail configured to distribute a first supply voltage;

a second power rail configured to distribute a second supply voltage, the second supply voltage being different from the first supply voltage; and a level shifting circuit coupled to the first power rail and the second power rail, wherein the level shifting circuit is configured to generate, using a control signal, an output signal having a continuous low logic value during ramp up of the second supply voltage, and wherein the level shifting circuit includes:

a first set of first voltage domain transistors that utilize the first supply voltage, wherein the first set of first voltage domain transistors includes:

a NAND gate configured to receive an input signal and the control signal and generate a first voltage domain signal based on the input signal and the control signal;

a first inverter configured to generate a complement of the first voltage domain signal;

a second inverter configured to generate a complement of the control signal; and a second set of second voltage domain transistors that utilize the second supply voltage, wherein the second set of second voltage domain transistors includes:

a network of transistors configured to generate, at an output node, a second voltage domain signal based on the first voltage domain signal and the complement of the first voltage domain signal; and an output suppressing transistor configured to couple the output node to a ground based on the complement of the control signal.

6. The apparatus of claim 5, wherein the output signal is generated using the second supply voltage.

7. The apparatus of claim 5, wherein the control signal is generated using the first supply voltage.

8. The apparatus of claim 5, wherein the level shifting circuit is configured to:

receive the input signal generated using the first supply voltage;

detect a second value of the control signal after the ramp up of the second supply voltage has completed; and generate, in response to detecting the second value, the output signal based on the input signal, wherein the output signal is a level shifted version of the input signal.

9. The apparatus of claim 8 further comprising:

a control circuit configured to:

count a number of cycles while the second supply voltage is ramping up; and determine, using the number of cycles, when the ramp up of the second supply voltage has completed.

10. The apparatus of claim 9, wherein the input signal is generated by a first device operating on the first supply voltage; and wherein a second device operating on the second supply voltage receives the output signal from the level shifting circuit.

11. The apparatus of claim 10 further comprising a chip that includes the first device, the second device, the level shifting circuit, and the control circuit.

12. The apparatus of claim 5, wherein the level shifting circuit includes an output suppressing transistor configured to couple the output signal to ground based on the control signal.

13. The apparatus of claim 5, wherein the output suppressing transistor is an n-channel transistor coupled between the output node and ground, wherein a gate of the output suppressing transistor is coupled to the complement of the control signal.

14. The apparatus of claim 5, wherein the network of transistors includes:

a first n-channel transistor coupled between a first node and ground, the first n-channel transistor being gated by the first voltage domain signal;

a first p-channel transistor coupled between the first node and a second p-channel transistor, the first p-channel transistor being gated by the first voltage domain signal;

the second p-channel transistor coupled between the second supply voltage and the first p-channel transistor, the second p-channel transistor being gated by the output node;

a second n-channel transistor coupled between the output node and ground, the second n-channel transistor being gated by the complement of the first voltage domain signal;

a third p-channel transistor coupled between the output node a fourth p-channel transistor, the third p-channel transistor being gated by the complement of the first voltage domain signal; and the fourth p-channel transistor coupled between the second supply voltage and the third p-channel transistor, the fourth p-channel transistor being gated by the first node.

15. A method comprising:

receiving, by a level shifting circuit, a control signal, wherein the level shifting circuit is coupled to a first power rail configured to distribute a first supply voltage and a second power rail configured to distribute a second supply voltage; and generating, by the level shifting circuit in response to detecting a first value of the control signal, an output signal having a continuous logic low value during a ramp up of the second supply voltage;

wherein the level shifting circuit includes a first set of first voltage domain transistors that utilize the first supply voltage, and a second set of second voltage domain transistors that utilized the second supply voltage;

receiving, by a NAND gate included in the first set of first voltage domain transistors, an input signal;

generating, by the NAND gate, a first voltage domain signal based on the input signal and the control signal;

generating, by a first inverter included in the first set of first voltage domain transistors, a complement of the first voltage domain signal;

generating, by a second inverter included in the first set of first voltage domain transistors, a complement of the control signal;

generating, at an output node by a network of transistors included in the second set of second voltage domain transistors, a second voltage domain signal based on the first voltage domain signal and the complement of the first voltage domain signal; and coupling, by an output suppressing transistor included in the second set of second voltage domain transistors, the output node to a ground based on the complement of the control signal.

16. The method of claim 15 further comprising:

receiving, by the level shifting circuit, an input signal generated using the first supply voltage;

detecting, by the level shifting circuit, a second value of the control signal after the ramp up of the second supply voltage has completed; and generating, by the level shifting circuit in response to detecting the second value, the output signal based on the input signal, wherein the output signal is a level shifted version of the input signal.

17. The method of claim 15, wherein the control signal is generated using the first supply voltage.

18. The method of claim 15, wherein the output signal is generated using the second supply voltage.

19. The method of claim 17 further comprising:

controlling, by a control circuit, the ramp up of the second supply voltage;

generating, by the control circuit, the control signal having the first value while the second supply voltage is ramping up; and generating, by the control circuit, the control signal having the second value after the ramp up of the second supply voltage has completed.

* * * * *